US006576533B2

(12) United States Patent
Tomiya et al.

(10) Patent No.: US 6,576,533 B2
(45) Date of Patent: Jun. 10, 2003

(54) METHOD OF FORMING SEMICONDUCTOR THIN FILM OF GROUP III NITRIDE COMPOUND SEMICONDUCTOR.

(75) Inventors: Shigetaka Tomiya, Kanagawa (JP); Kenji Funato, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/055,885

(22) Filed: Jan. 28, 2002

(65) Prior Publication Data

US 2002/0115267 A1 Aug. 22, 2002

Related U.S. Application Data

(62) Division of application No. 09/448,866, filed on Nov. 24, 1999.

(30) Foreign Application Priority Data

Nov. 26, 1998 (JP) ............................................. 10-336307

(51) Int. Cl.$^7$ ......................... H01L 21/20; H01L 21/36
(52) U.S. Cl. .......................................... 438/481; 438/46
(58) Field of Search ...................... 117/95, 952; 257/14, 257/15, 17, 18, 22, 190, 200, 401, 618, 623, 627, 628; 438/41, 44, 46, 47, 481, 483, 497, 503, 507

(56) References Cited

U.S. PATENT DOCUMENTS 6,225,650 B1 * 5/2001 Tadatomo et al. .......... 257/190
6,500,747 B1 * 12/2002 Lee et al. .................... 438/604

FOREIGN PATENT DOCUMENTS

| EP | 0 469 790 A1 | 2/1992 |
| EP | 0 609 799 A2 | 8/1994 |
| JP | 08064791 | 3/1996 |

OTHER PUBLICATIONS

Sakai, "Defect structure in selectively grown GaN films with low threading dislocation density", Appl. Phys. Lett., vol. 71 (16), pp. 2259–2261, 1997.*
Wolf and Tauber, "Silicon processing for the VLSI Era", vol. 1, Chapter 16, pp. 555–556, Lattice press, California, 1986.*
Shuji Nakamura, et al., *Present status of InGaN/GaN/AlGaN–based laser diodes*, Journal of Crystal Growth 189/190 (1998) 820–825.

(List continued on next page.)

Primary Examiner—Kamand Cuneo
Assistant Examiner—Asok Kumar Sarkar
(74) Attorney, Agent, or Firm—Rader, Fishman & Grauer PLLC; Ronald P. Kananen

(57) ABSTRACT

A semiconductor thin film includes an underlying semiconductor layer in which a plurality of facets are arranged, and a selectively grown/buried semiconductor layer formed to cover the underlying semiconductor layer, wherein the facets are formed by planes tilted with respect to the disposition plane of the underlying semiconductor layer. In this semiconductor thin film, threading-dislocations are formed in the selectively grown/buried semiconductor layer in such a manner that each of the threading-dislocations bendingly extends from one of the facets of the underlying semiconductor layer in the direction substantially along the disposition plane of the underlying semiconductor layer, being joined to another of the threading-dislocations bendingly extending from the opposed one of the facets, and bendingly extends from the joined portion in the direction crossing the disposition plane of the underlying semiconductor layer. As a result, low defect density regions are formed in the selectively grown/buried semiconductor layer. Further, since a $SiO_2$ mask is not buried, a deviation in crystal orientation can be suppressed.

49 Claims, 10 Drawing Sheets

OTHER PUBLICATIONS

Shuji Nakamura, et al., *High–Power, Long–Lifetime InGaN Multi–Quantum–Well–Structure Laser Diodes*, Jpn. J. Appl. Phys. vol. 36, (1997) pp. 1059–1061.

Akira Usui, et al., *Thick GaN Epitaxial Growth with Low Dislocation Density by Hydride Vapor Phase Epitaxy*, Jpn. J. Appl. Phy. vol. 36 (197) pp. 899–902.

Sjuji Nakamura, et al., *InGaN–Based Multi–Quantum–Well Structure Laser Diodes*, Jpn. J. Appl. Phys. vol. 35 (1996) pp. 74–76.

Ok–Hyun Nam et al., Lateral epitaxy of low density GaN layers via organometallic vapor phase epitaxy; *Appl. Phys. Lett.*, 71, 2638 (1997).

\* cited by examiner

METHOD OF FORMING SEMICONDUCTOR THIN FILM OF GROUP III NITRIDE COMPOUND SEMICONDUCTOR.

This is a divisional application of U.S. patent application Ser. No. 09/448,866 filed Nov. 24, 1999.

BACKGROUND OF THE INVENTION

The present invention relates to a semiconductor thin film made from a compound semiconductor typically composed of a group III nitride, a semiconductor element using the semiconductor thin film, and a semiconductor device using the semiconductor element, and fabrication methods thereof.

In recent years, semiconductor light emitting devices, such as a semiconductor laser or a light emitting diode (LED), enabling light emission in a range from a visible light region to an ultraviolet light region by using group III nitride based compound semiconductors such as AlGaInN have been actively developed. In particular, in the optical recording field, a semiconductor laser capable of emitting light in a short-wavelength region has been required to be practically used for improving the recording density of optical disks or the like.

Recently, an AlGaInN based semiconductor laser capable of realizing continuous oscillation for 300 hr at room temperature has been reported in Jpn. J. Appl. Phys. 35L74 (1996); and ditto 36L1059 (1997), in which a semiconductor layer made from a group III nitride based compound semiconductor is grown on a substrate made from sapphire via a buffer layer made from gallium nitride (GaN) by a metal organic chemical vapor deposition (MOCVD) method.

The above-described semiconductor laser, however, has a problem. As is apparent from a curve showing a change in drive voltage applied to the semiconductor laser with elapsed time, the drive voltage is gradually increased from the initial current-carrying period. This means that the voltage characteristic is gradually degraded with elapsed time. The degradation of the voltage characteristic may be dependent on the fact that the group III nitride based compound semiconductor layer formed on the substrate has threading-dislocations (which are defects propagated to pass through the crystal) at a density ranging from about $1 \times 10^8$ /cm$^2$ to about $1 \times 10^9$ /cm$^2$.

Accordingly, to realize the practical life time of the semiconductor laser for 10,000 hr or more, it is required to reduce the density of the threading-dislocations, and to meet such a requirement, various methods have been examined.

One method has been proposed in Jpn. J. Appl. Phys. 36 L899 (1997) and Appl. Phys. Lett., 71, 2638 (1997), in which a GaN underlying layer is formed on a sapphire substrate via a buffer layer, a mask layer made from silicon dioxide (SiO$_2$) and having a periodical pattern of stripes (width; 1 to 4 µm) arranged with a pitch of 7 µm is stacked on the GaN layer; and a GaN layer is grown on the mask layer selectively in the lateral direction by a halide vapor-deposition method or MOCVD method. In the case of adopting the method of growing the GaN semiconductor layer on the mask layer in the lateral direction by selectively growing GaN from the underlying GaN layer exposed from openings between the periodical stripes of the mask layers, the density of threading-dislocations in the GaN layer on the SiO$_2$ mask layer can be reduced to about $1 \times 10^7$ /cm$^2$.

As is reported in Journal of Crystal Growth, vol. 189–190 P. 820–5 (1998), an AlGaInN based semiconductor laser diodes formed on the semiconductor layer prepared by adopting the above method can realize the practical life time of 1150 hr or more.

Incidentally, with respect to the semiconductor layer formed by selective growth using the above-described mask layer, it has been revealed by the present inventors that a deviation in crystal orientation (c-axis), which is in the order of 0.4–0.5°, occurs between a portion of the semiconductor layer on the stripe of the mask layer and a portion of the semiconductor layer in the opening of the mask layer.

If a semiconductor element is formed on the semiconductor layer having such a deviation in crystal orientation, an active region of the semiconductor element contains the deviation in crystal plane. As a result, various characteristics of the semiconductor element are degraded, and if the semiconductor element is configured as a semiconductor laser, light emission efficiency and life time are reduced.

The problem of the conventional method above mentioned will be more fully described. A substrate for growth of a GaN based semiconductor, which is made from sapphire or SiC as described above, is largely different from the GaN based semiconductor in lattice constant and thermal expansion coefficient, and consequently, if the GaN based semiconductor is directly grown on the substrate, defects such as dislocations occur in the growth layer, with a result that it is difficult to grow a high quality single crystal of the GaN based semiconductor epitaxial layer.

For this reason, as described above, an underlying GaN layer containing high density threading-dislocations, which is formed on the sapphire substrate or SiC substrate via a buffer layer; a mask layer made from SiO$_2$ and being patterned into stripes arranged with a specific pitch is formed on the underlying GaN layer; and GaN is grown from the underlying GaN layer exposed through openings between the stripes of the mask layer selectively in the lateral direction, to thereby form the GaN semiconductor containing defects at a low density on the mask layer. However, as a result of analyzing the sample thus prepared by electron diffraction or X-ray diffraction, it was proved that a deviation in crystal orientation, which is in the order of 0.4–0.5°, occurs between a portion of the GaN semiconductor layer formed on the stripe of the mask layer and a portion of the GaN semiconductor layer formed in the opening of the mask layer.

The reason why there occurs a deviation in crystal orientation (c-axis) is that upon lateral growth of GaN on the SiO$_2$ mask layer, there occurs a deviation in crystal growth direction between a portion on the stripe of the mask layer and a portion in the opening of the mask layer.

Based on the structural analysis by the present inventors using transmission electron microscopy or X-ray diffraction method, it became evident that if the orientation of the stripes of the SiO$_2$ mask is set to the <11–20> direction and a deviation in the crystal growth direction occurs along the <11–20> direction, crystal defects are induced; but if the orientation of the stripes of the SiO$_2$ mask is set to the <1–100> direction and a deviation in the crystal growth direction occurs along the <1–100> direction, crystal defects are not induced. In each case, however, there occurs a deviation in crystal growth orientation mainly depending on a difference in thermal expansion coefficient between SiO$_2$ as the mask material and GaN. As a result, if the SiO$_2$ mask layer is not present in the lateral growth of GaN, it is possible to suppress the deviation in crystal growth orientation.

However, since the SiO$_2$ mask layer is provided for removing threading-dislocations from the substrate side to the semiconductor layer, removal of the mask layer is incompatible with the purpose of reducing the defect density of the semiconductor layer.

SUMMARY OF THE INVENTION

An object of the present invention is to provide a semiconductor thin film capable of reducing the density of threading-dislocations and also suppressing occurrence of a deviation in crystal orientation, a semiconductor element using the semiconductor thin film, and a semiconductor device using the semiconductor element. Another object of the present invention is to provide methods of fabricating the above semiconductor thin film, semiconductor element, and semiconductor device.

The present inventors have found that while in the lateral growth of a semiconductor, threading-dislocations are bent by growth facets generated accompanied by the growth, such bending of the threading-dislocations can be performed not only by the above growth facets but also by facets artificially formed, and on the basis of the knowledge, the present inventors have accomplished a semiconductor thin film capable of reducing the density of the threading-dislocations at a specific region and also suppressing occurrence of a deviation in crystal orientation, and a semiconductor element using the semiconductor thin film, and a semiconductor device using the semiconductor element, and fabrication methods thereof.

According to a first aspect of the present invention, there is provided a semiconductor thin film including an underlying semiconductor layer in which a plurality of facets are arranged, and a selectively grown/buried semiconductor layer formed to cover the underlying semiconductor layer, wherein the facets of the underlying semiconductor layer are formed by planes tilted with respect to the disposition plane of the underlying semiconductor layer.

According to a second aspect of the present invention, there is provided a semiconductor element including a semiconductor thin film having an underlying semiconductor layer in which a plurality of facets are arranged and a selectively grown/buried semiconductor layer formed to cover the underlying semiconductor layer, and a semiconductor element main body formed on the semiconductor thin film, that is, on the selectively grown/buried semiconductor layer or on a semiconductor layer formed thereon, wherein the facets are formed by planes tilted with respect to the disposition plane of the underlying semiconductor layer.

According to a third aspect of the present invention, there is provided a semiconductor device including: a semiconductor element including a semiconductor thin film and a semiconductor element main body formed on the semiconductor thin film, the semiconductor thin film having an underlying semiconductor layer in which a plurality of facets are arranged and a selectively grown/buried semiconductor layer formed to cover the underlying semiconductor layer; wherein the facets are formed by planes tilted with respect to the disposition plane of the underlying semiconductor layer. Concretely, the semiconductor device of the present invention may be a single semiconductor device using the semiconductor element or a semiconductor integrated circuit system using a plurality of the semiconductor elements.

According to a fourth aspect of the present invention, there are provided methods of fabricating the above-described semiconductor thin film, semiconductor element and semiconductor device, each method including the steps of forming an underlying semiconductor layer on a substrate in such a manner that a plurality of facets are arranged in the underlying semiconductor layer, and growing a selectively grown/buried semiconductor layer in such a manner that the selectively grown/buried semiconductor layer covers the underlying semiconductor layer, wherein the facets are formed by planes tilted with respect to the disposition plane of the underlying semiconductor layer.

In accordance with one preferred embodiment of the fabrication method of the present invention, the facets of the underlying semiconductor layer are artificially formed, and the selectively grown/buried semiconductor layer is epitaxially grown on the underlying semiconductor layer.

In accordance with another preferred embodiment of the fabrication method, a mask is formed on a plane of the substrate on which the underlying semiconductor layer is to be formed; the underlying semiconductor layer having the facets is formed by selective growth, so-called ELO (Epitaxy Laterally Overgrowth), and the mask is removed; and the selectively grown/buried semiconductor layer is epitaxially grown.

As described above, according to the semiconductor thin film, the semiconductor element, and the semiconductor device, and the fabrication methods thereof of the present invention, the selectively growth/buried semiconductor layer is selectively grown from the facets, that is, tilting planes of the underlying semiconductor layer. With this configuration, threading-dislocations are formed in the selectively grown/buried semiconductor layer in such a manner that each of the threading-dislocations laterally extends, that is, bendingly extends from one of the facets of the underlying semiconductor layer in the direction substantially along the disposition plane of the underlying semiconductor layer, being joined to another of the threading-dislocations bendingly extending from the opposed one of the facets, and bendingly extends from the joined portion in the direction crossing the disposition plane of the underlying semiconductor layer. As a result, low defect density regions in which the threading-dislocations are little present can be formed at portions other than the above joined portions of the threading-dislocations in the selectively grown/buried semiconductor layer.

Further, according to the present invention, since the configuration in which the mask made from $SiO_2$ or the like is buried is not adopted, it is possible to avoid occurrence of the above-described deviation in crystal orientation (C-axis).

According to the semiconductor element of the present invention and the semiconductor device using the semiconductor element, since an active region (operational region) of the semiconductor element is formed on a low defect density region of the selectively grown/buried semiconductor layer or on a semiconductor layer formed thereon, it is possible to enhance the characteristics of the semiconductor element.

It should be noted that the facet of the present invention means not only a perfect tilting plane but also a plane which is somewhat curved partially or entirely and which has a principal plane tilted at a specific angle $\alpha$.

DETAILED DESCRIPTION OF THE PREFERRED EMBODIMENTS

Hereinafter, embodiments of the present invention will be described with reference to the accompanying drawings.

Figure 1:
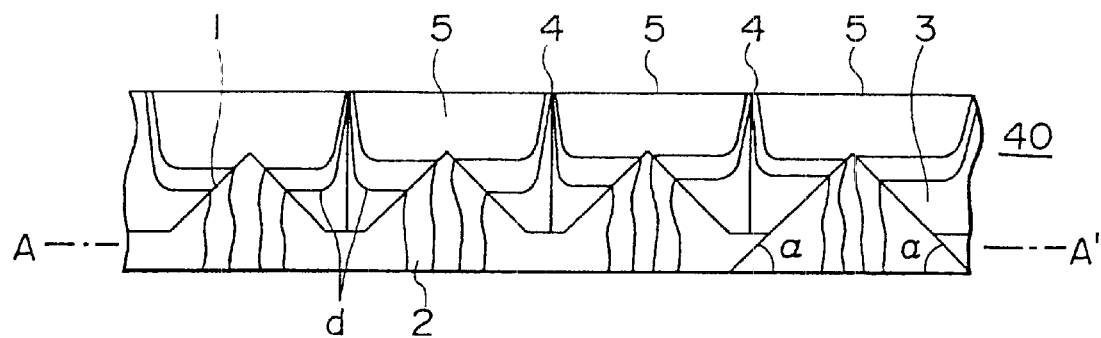
FIG. 1 is a schematic sectional view of one embodiment of a semiconductor thin film of the present invention.

FIG. 1 is a schematic sectional view of one embodiment of a semiconductor thin film of the present invention. The semiconductor thin film has an underlying semiconductor layer 2 in which a plurality of facets 1 are arranged, and a selectively grown/buried semiconductor layer formed to cover the underlying semiconductor layer 2. The underlying semiconductor layer 2 is made from a compound semiconductor of a group III nitride type containing gallium (Ga) and nitride (N). The selectively grown/buried semiconductor layer is also made from a compound semiconductor of a group III nitride containing Ga and N. The facet 1 is formed by a plane tilted with respect to a disposition plane A of the underlying semiconductor layer 2.

Threading-dislocations "d", shown by fine lines in FIG. 1, in the selectively grown/buried semiconductor layer 3 are formed in such a manner that each of the threading-dislocations "d" bendingly extends from one of the facets 1 of the underlying semiconductor layer 2 in the direction substantially along the disposition plane of the underlying semiconductor layer 2, being joined to another of the threading-dislocations "d" bendingly extending from the opposed one of the facets 1, and bendingly extends from the joined portion in the direction crossing the disposition plane of the underlying semiconductor layer 2, more specifically, substantially in the vertical direction.

As a result, in the selectively grown/buried semiconductor layer 3 formed to cover the underlying semiconductor layer 2, high defect density regions 4 having the threading-dislocations at a high density are formed at the joined portions of the threading-dislocations "d"; however, low defect density regions 5 in which threading-dislocations are little present are formed at the remaining portions.

Figure 2:
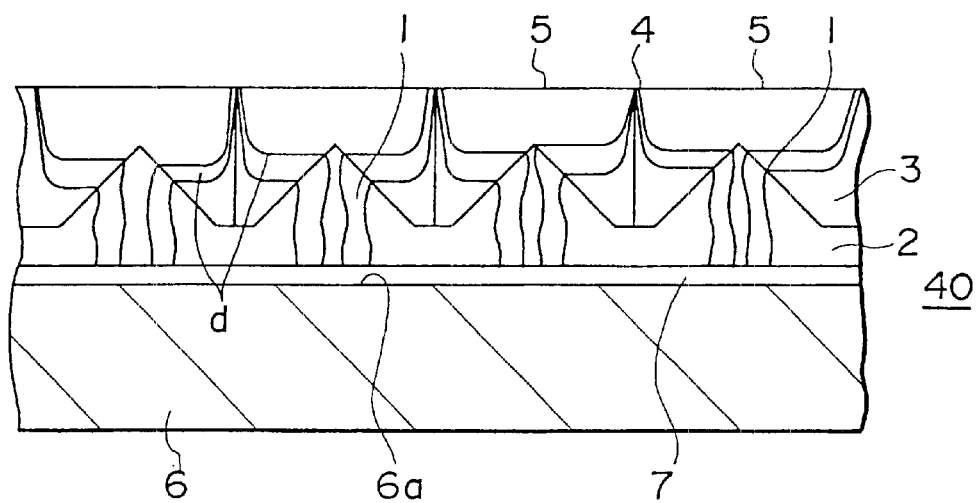
FIG. 2 is a schematic sectional view of another embodiment of the semiconductor thin film of the present invention.

FIG. 2 is a schematic sectional view of another embodiment of the semiconductor thin film of the present invention. A substrate 6 made from C-face sapphire or SiC is first prepared. Subsequently, an underlying semiconductor layer 2 in which facets 1 are arranged is formed on one principal plane 6a of the substrate 6 via a buffer layer 7.

Figure 3:
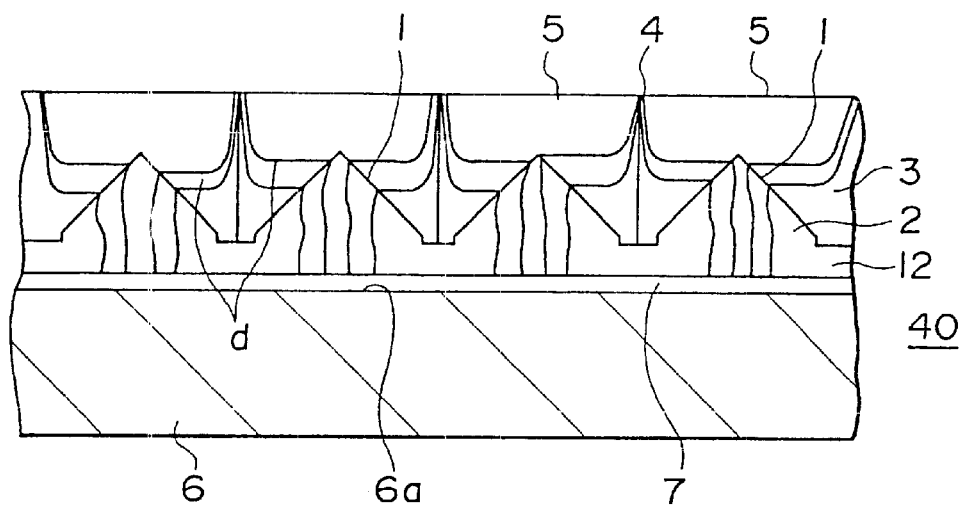
FIG. 3 is a schematic sectional view of a further embodiment of the semiconductor thin film of the present invention.

FIG. 3 is a schematic sectional view of a further embodiment of the semiconductor thin film of the present invention. A substrate 6 made from C-face sapphire or SiC is first prepared. Subsequently, an underlying layer 12 is formed on one principal plane 6a of the substrate 6 via a buffer layer 7, and an underlying semiconductor layer 2 in which facets 1 are arranged is formed on the underlying layer 12.

Figure 4:
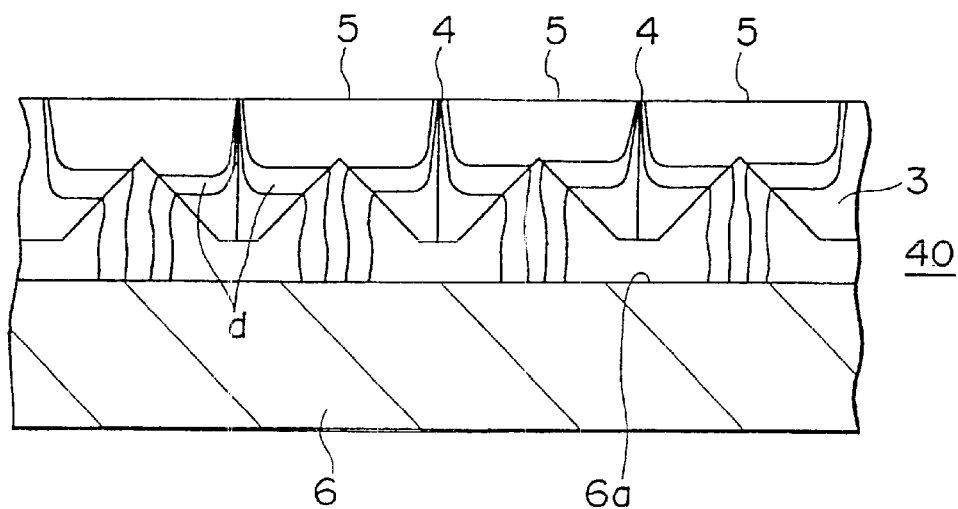
FIG. 4 is a schematic sectional view of a further embodiment of the semiconductor thin film of the present invention.
Figure 5:
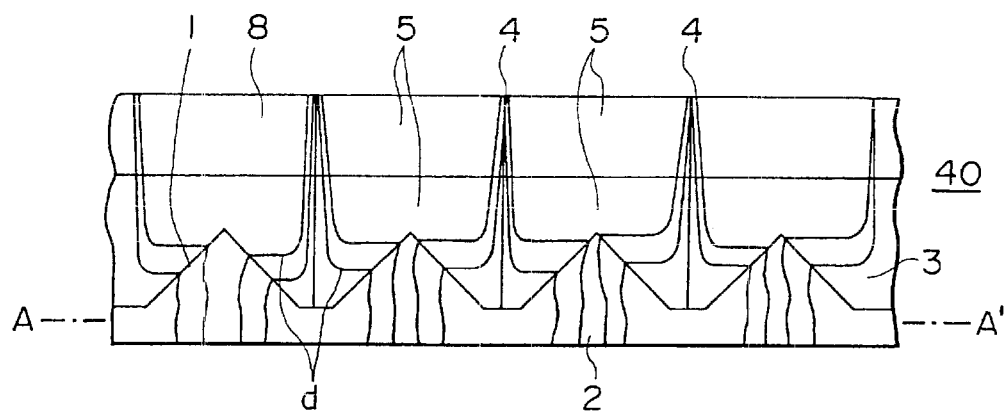
FIG. 5 is a schematic sectional view of a further embodiment of the semiconductor thin film of the present invention.

FIG. 4 is a schematic sectional view of still a further embodiment of the semiconductor thin film of the present invention. A substrate 6 made from a single crystal of a group III nitride is first prepared, and subsequently an underlying semiconductor layer 2 made from a group III nitride in which facets 1 are arranged is directly formed on one principal plane 6a of the substrate 6.

FIGS. 5 to 8 are schematic sectional views of additional embodiments of the semiconductor thin film of the present invention. Each of the embodiments shown in FIGS. 5 to 8 is configured such that a compound semiconductor layer 8 made from a group III nitride containing nitrogen (N) and at least one kind of group III element selected from a group consisting of gallium (Ga), aluminum (Al), boron (B) and indium (In) is epitaxially grown on the selectively grown/buried semiconductor layer 3 described in the associated one of the embodiments shown in FIGS. 1 to 4. In this case, the threading-dislocations in the underlying selectively grown/buried semiconductor layer 3 extend in the compound semiconductor layer 8, and high defect density regions 4 and low defect density regions 5 with no threading-dislocations are formed in the compound semiconductor layer 8.

One embodiment of a semiconductor element of the present invention is characterized in that at least an active region, that is, an operational region affected by crystal defects of the semiconductor element is formed in the low defect density region 5 of the selectively grown/buried semiconductor layer of each of the semiconductor thin films shown in FIGS. 1 to 4.

Another embodiment of the semiconductor element of the present invention is characterized in that at least an active region, that is, an operational region affected by crystal defects of the semiconductor element is formed in the low defect density region 5 of the compound semiconductor layer 8 of each of the semiconductor thin films shown in FIGS. 5 to 8.

It should be noted that in FIGS. 2 to 8, parts corresponding to those in FIG. 1 are designated by the same characters and the overlapped explanation thereof is omitted.

With respect to the semiconductor thin film in each of the above embodiments, a deviation in crystal orientation, that is, a deviation in c-axis between the underlying semiconductor layer 2 and the selectively grown/buried semiconductor layer 3 or between the underlying semiconductor layer 2 and the compound semiconductor layer 8 expitaxially grown on the selectively grown/buried semiconductor layer 3 is set to be in a range of 0.1° or less.

Next, one embodiment of a method of fabricating a semiconductor thin film according to the present invention will be described with reference to FIGS. 9A to 9C and FIGS. 10A and 10B.

Figure 9A:
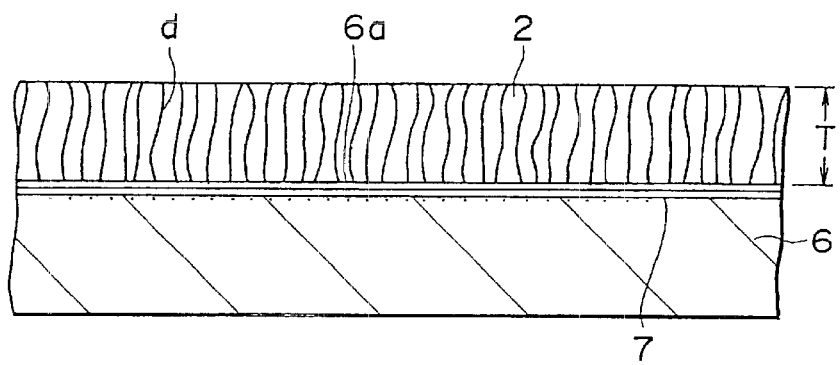
FIGS. 9A to 9C are schematic sectional views showing fragments of a semiconductor thin film at processing steps of one embodiment of a method of fabricating a semiconductor thin film of the present invention.

Referring to FIG. 9A, a substrate 6 made from a C-face sapphire is prepared, and a buffer layer 7 made from GaN is formed on one principal plane 6a of the C-face sapphire to a thickness of 30 nm by the MOCVD method. In the MOCVD method, a substrate temperature is set at 520° C. and trimethyl gallium gas (($CH_3)_3Ga$)) and ammonia gas ($NH_3$) are used as a source gas.

An underlying semiconductor layer 2 made from GaN is formed on the buffer layer 7 to a thickness of 2 $\mu$m by the MOCVD method. In the MOCVD method, a substrate temperature is set at 1050° C., and the same source gas as that for forming the buffer layer 7 is used. It should be noted that threading-dislocations d, schematically shown by fine lines in FIG. 9A, are present in the underlying semiconductor layer 2 at a high density of, for example, $1\times10^9$ /$cm^2$.

Figure 9B:
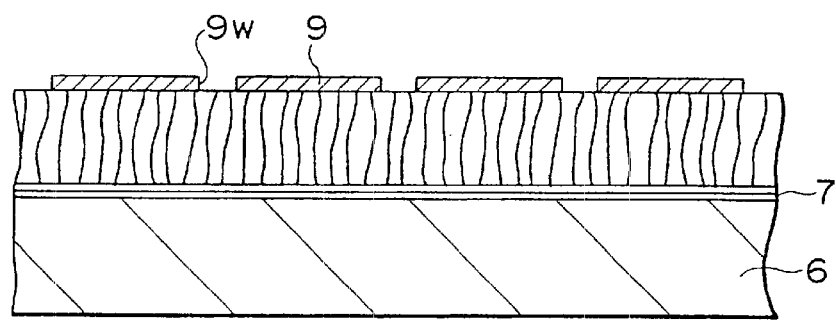

Referring to FIG. 9B, a mask 9 is formed on the underlying semiconductor layer 2. The mask 9 is formed by forming a dielectric $SiO_2$ layer over the entire surface of the underlying semiconductor layer 2 at a substrate temperature of 450° C. by a CVD method, and patterning the $SiO_2$ layer by photolithography and etching. To be more specific, the $SiO_2$ layer is coated with a photoresist layer, and the photoresist layer is subjected to exposure and development into a desired pattern having a plurality of stripes spaced at specific intervals. The $SiO_2$ layer is selectively etched using such a patterned photoresist layer as a mask, to form the mask 9 having stripe-shaped openings 9w. In the mask 9, the stripes extend in the <1-100> direction (perpendicular to the paper plane in FIG. 9B) and arranged at the specific intervals in the <11-20> direction.

The resultant substrate in which the mask 9 has been formed on the underlying layer 2 is cleaned by acetone ($CH_3COCH_3$) and methanol ($CH_3OH$), being dipped in diluted hydrochloric acid (HCl) or diluted hydrofluoric acid for 10 sec, and is cleaned by pure water.

Figure 9C:
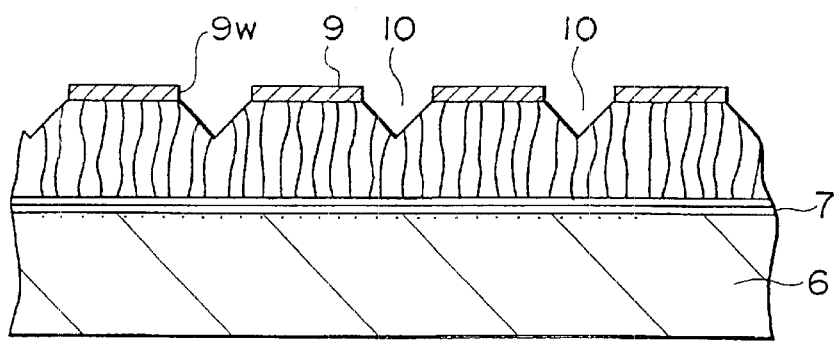
Figure 10A:
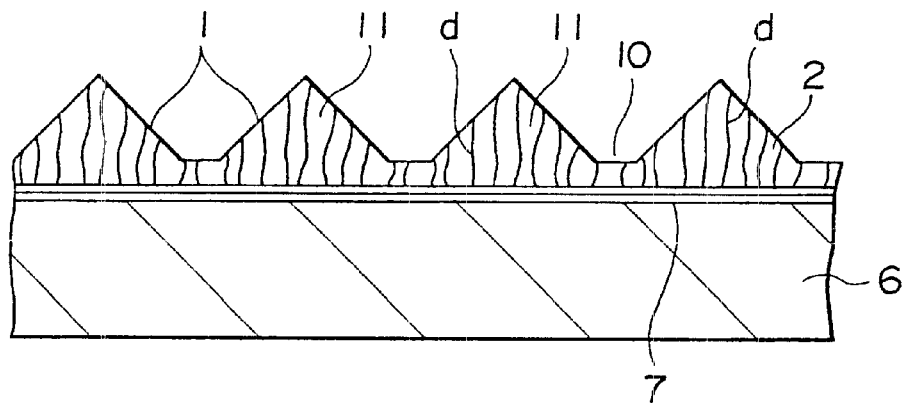
FIGS. 10A and 10B are schematic sectional views showing fragments of the semiconductor thin film at processing steps subsequent to those shown in FIGS. 9A to 9C.

The interiors of the openings 9w of the mask 9 are selectively etched by reactive ion etching (RIE). At this time, the stripe portions of the mask 9 composed of the $SiO_2$ layer is somewhat etched, with a result that as shown in FIG. 9C, the width of each opening 9w is widened and simultaneously the underlying semiconductor layer 2 is partially etched, to form grooves 10 each having an approximately V-shaped cross-section. By continuing the above etching, the grooves 10 become deeper and wider, so that as shown in FIG. 10A, the mask 9 is removed and the upper ends of the adjacent ones of the grooves 10 are joined to each other. As a result, stripes 11 each having a triangular cross-section are formed in such a manner as to be arranged in parallel to each other, and facets 1 oppositely tilted at a specific angle are formed on both side of each stripe 11. The RIE used for forming the grooves 10 is performed by a parallel plate type RIE system using $BCl_3$ and $N_2$ as a source gas under a condition with a power of 15 W and a pressure of 20 mTorr.

By performing the RIE in the above condition, the facets 1 tilted at 45° with respect to the substrate plane, that is, to the underlying semiconductor 2, are formed on both side surfaces of each stripe 11 extending in the <1-100> direction.

The resultant substrate 6 on which respective semiconductor layers have been stacked is sufficiently dipped in hydrofluoric acid (HF) to remove the $SiO_2$ film remaining on the surface, and is then cleaned by pure water.

On the underlying semiconductor layer 2 thus cleaned in which facets 1 are arranged, high quality GaN is epitaxially grown by the MOCVD method. At this time, GaN is selectively grown from the facets 1 in the lateral direction or in the <11-20> direction, that is, in the lateral direction along the disposition plane of the underlying semiconductor layer 2. By continuing the selective growth, the portions of GaN grown from the opposed facets 1 collide into each other, to bury the grooves 10, and by further continuing the selective growth, GaN is grown in the direction crossing the disposition plane of the underlying semiconductor layer 2, more specifically, substantially in the vertical direction with respect to the disposition plane of the underlying semiconductor layer 2. As a result, a selectively grown/buried semiconductor layer 3 made from GaN and having a flat surface is formed to entirely cover the underlying semiconductor layer 2.

In this MOCVD method used for forming the selectively grown/buried semiconductor layer 3, a substrate temperature is set at 1050° C., and ammonia gas and trimethyl gallium gas are used as a source gas. To be more specific, ammonia gas is allowed to flow at a flow rate being as slightly large as typically 10 l/min and trimethyl gallium gas is fed at such a flow rate that the film growth rate becomes about 4 $\mu$m/hr. Under such a condition, both the gases are allowed to react with each other at atmospheric pressure.

Figure 10B:
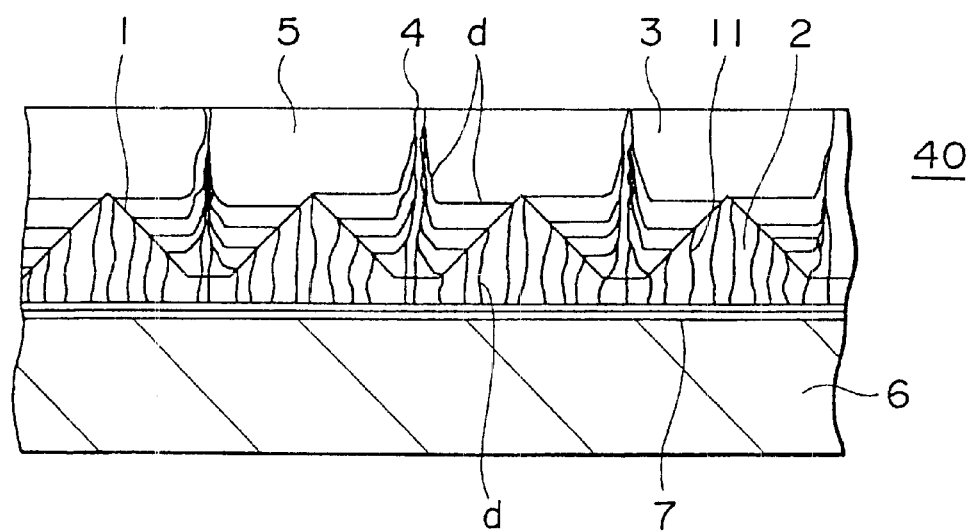

In this way, as shown in FIG. 10B, GaN is grown to perfectly bury the grooves 10, to form the selectively grown/buried semiconductor layer 3 having a flat surface.

The selectively grown/buried semiconductor layer 3 thus formed was observed by a transmission electron microscope. As a result, it was confirmed that dislocations "d" in the underlying semiconductor layer 2 are bent at the facets 1. Accordingly, at the stage of selective growth of GaN for forming the selectively grown/buried semiconductor layer 3, until the portions of GaN grown from the opposed facets 1 collide with each other, the dislocations "d" passing through the underlying semiconductor layer 2 in the direction substantially perpendicular to the c-axis are bent at the facets 1 which are pseudo-facets artificially formed on the side surfaces of the grooves 10 by etching, and extend not in the vertical direction but in the horizontal direction substantially along the disposition plane of the underlying semiconductor layer 2, that is, along the principal plane of the substrate 6.

When the portions of GaN grown from the opposed facets 1 collide with each other, the threading-dislocations "d" extending from the opposed facets 1 are joined to each other and are partially bent, and extend upwardly in the direction crossing the disposition plane of the underlying semiconductor layer 2, that is, in the stacked direction. As a result, the defect density in the selectively grown/buried semiconductor layer 3 is reduced to $1\times10^7$/$cm^2$.

Accordingly, in the selectively grown/buried semiconductor layer 3, high defect density regions 4 having the threading-dislocations at a high density occur at the joined portions of the threading-dislocations; however, low defect density regions 5 having the dislocations at a low density are formed at the remaining portions.

Since the selectively grown/buried semiconductor layer 3 thus formed is in direct-contact with the underlying semiconductor layer 2 with any mask made from $SiO_2$ layer or the like for selective growth not put therebetween, a deviation in c-axis between the selectively grown/buried semiconductor layer 3 and the substrate 6 is in a range of 1° or less.

According to the fabrication method in this embodiment, since the low defect density regions 5 having the dislocations at a low density are formed and the deviation in crystal orientation is suppressed, a semiconductor thin film 40 including the selectively grown/buried semiconductor layer 3 having an extremely high quality can be formed. Accordingly, by providing a semiconductor element or a semiconductor element main body of a semiconductor device on the low defect density regions 5 of the semiconductor thin film 40, it is possible to obtain the semiconductor element or the semiconductor device with an extremely high reliability.

Next, another embodiment of the method of fabricating a semiconductor thin film according to the present invention will be described with reference to FIGS. 11A to 11C and FIGS. 12A and 12B.

In this embodiment, a substrate 6 made from C-face sapphire is prepared, and a buffer layer 7 made from GaN is formed on a principal plane 6a of the substrate 6 to a thickness of 30 nm by the MOCVD method. In this MOCVD method, a substrate temperature is set at 520° C., and trimethyl gallium gas ((CH$_3$)$_3$Ga) and ammonia gas (NH$_3$) are used as a source gas. An underlying layer 12 made from GaN is flatly formed on the buffer layer 7 to a thickness of 2 μm by the MOCVD method. In this MOCVD method, a substrate temperature is set at 1050° C., and the same source gas as that used for forming the buffer layer 7 is used.

The buffer layer 7, which is a crystal layer near an amorphous layer grown at the low temperature, acts as nuclei for growing the underlying layer 12. The underlying layer 12, made from crystals, has threading-dislocations "d" extending in the stacked direction at a density of about 1×10$^9$ /cm$_2$.

Figure 11A:
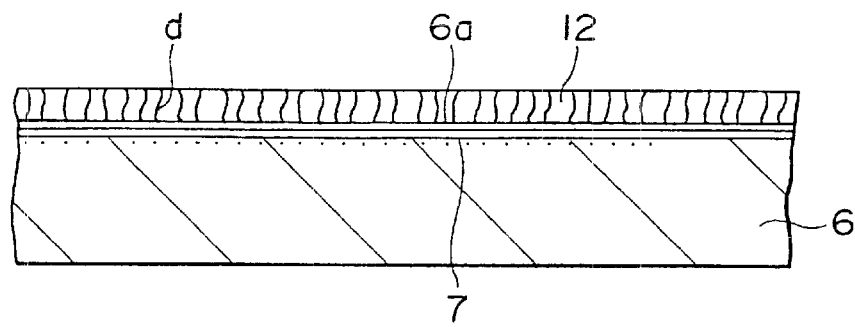
FIGS. 11A to 11C are schematic sectional views showing fragments of a semiconductor thin film at processing steps of another embodiment of a method of fabricating a semiconductor thin film of the present invention.
Figure 11B:
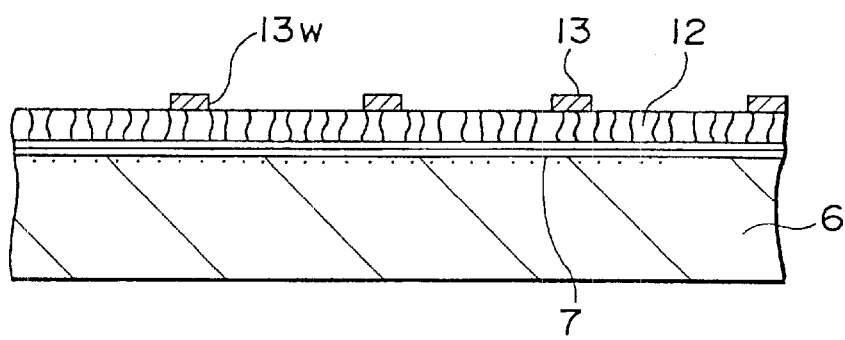
Figure 11C:
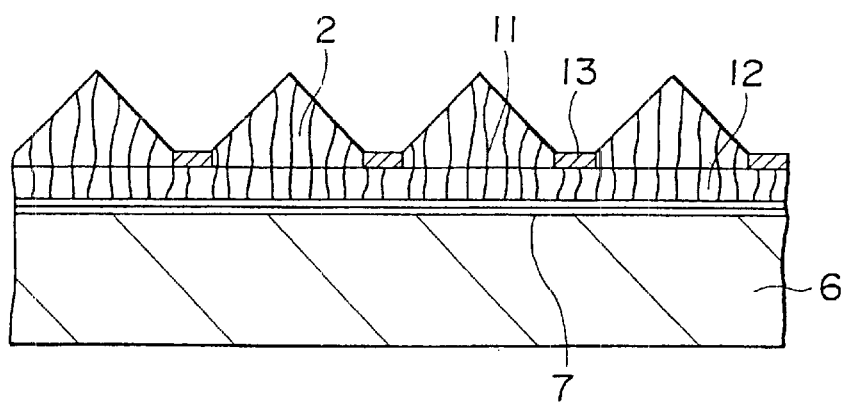
Figure 12A:
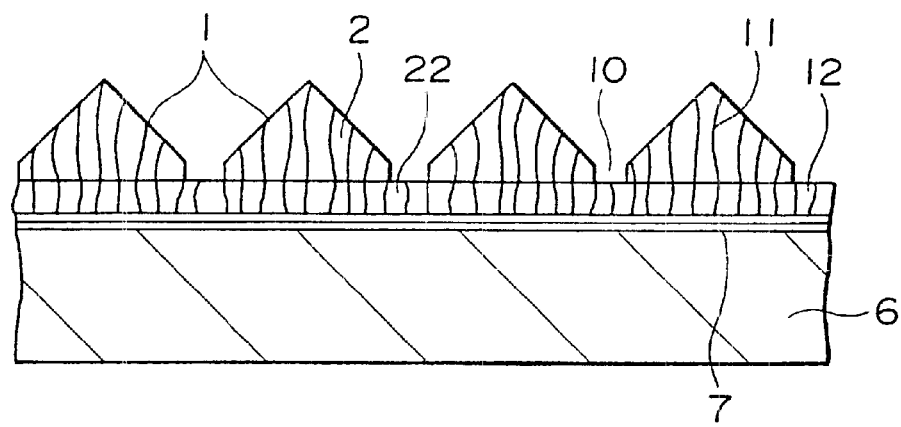
FIGS. 12A and 12B are schematic sectional views showing fragments of the semiconductor thin film at processing steps subsequent to those shown in FIGS. 11A to 11C.
Figure 12B:
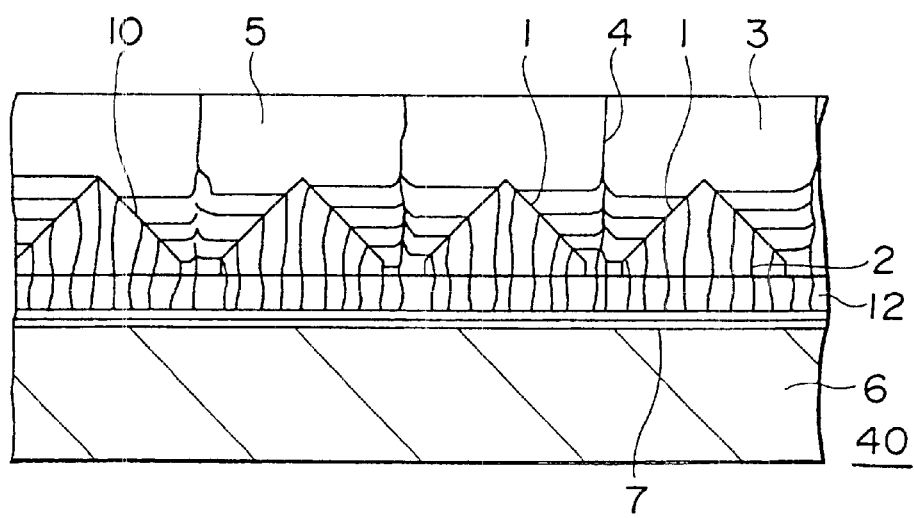

To form on the flat underlying layer 12 an underlying semiconductor layer in which facets are arranged, as shown in FIG. 11B, a mask 13 made from SiO$_2$ for selective growth of a semiconductor is formed on the flat underlying layer 12 to a thickness of 5 μm. The selective growth mask 13 has a pattern in which stripes extending in the <11-20> direction are arranged in parallel to each other with a pitch of 12 μm (for example, width: 5 μm, interval: 7 μm) in the <1-100> direction.

To be more specific, the selective growth mask 13 is formed by forming a SiO$_2$ layer on the entire surface of the underlying layer 12 at a substrate temperature of 450° C. by the CVD method; and patterning the SiO$_2$ layer by photolithography and pattern etching, that is, coating the SiO$_2$ layer with a photoresist, patterning the photoresist layer by pattern exposure and development, and selectively etching the SiO$_2$ layer using the patterned photoresist layer as an etching mask, to form stripe-shaped openings 13w.

The resultant substrate, on which the selective growth mask 13 has been formed on the underlying layer 12, is cleaned by acetone (CH$_3$COCH$_3$) and methanol (CH$_3$OH), being dipped in diluted hydrochloric acid (HCl) or diluted hydrofluoric acid (HF) for about 10 sec, and is cleaned by pure water. Further, the substrate is sufficiently dipped in hydrofluoric acid (HF), to perfectly remove SiO$_2$ remaining on the surface of the underlying layer 12 exposed to the outside through the openings 13w of the selective growth mask 13, and is cleaned by pure water.

A high quality underlying semiconductor layer 2 made from GaN is grown on the underlying layer 12 exposed to the outside through the openings 13w using the selective growth mask 13 as a mask by the MOCVD method until the underlying semiconductor layer 2 covers the mask 13. In the underlying semiconductor layer 2, stripes 11 each having a triangular cross-section periodically extend in the <11-20> direction and facets 1, each being tilted at about 69° with respect to the C-face of the {1-101} faces, that is, to the disposition plane of the underlying semiconductor layer 2, are formed on both side surfaces of each stripe 11. In this MOCVD method used for forming the underlying semiconductor layer 2, a substrate temperature is set at 1050° C., and ammonia gas and trimethyl gallium gas are used as a source gas. To be more specific, ammonia gas is allowed to flow at a flow rate being as slightly large as typically 10 l/min and trimethyl gallium gas is fed at such a flow rate that the film growth rate becomes about 4 μm/hr. Under such a condition, both the gases are allowed to react with each other at atmospheric pressure.

The resultant substrate, on which the underlying semiconductor layer 2 has been formed on the underlying layer 12, is sufficiently dipped in hydrofluoric acid (HF) to perfectly remove the selective growth mask 13 by etching. After that, the substrate is cleaned by acetone (CH$_3$COCH$_3$) and methanol (CH$_3$OH), being dipped in diluted hydrochloric acid (HCl) or diluted hydrofluoric acid (HF) for about 10 sec, and is cleaned by pure water.

A selectively grown/buried semiconductor layer 3 made from high quality GaN is selectively grown on the underlying semiconductor layer 2 in which the facets 1 are arranged by the MOCVD method. In this MOCVD method, a substrate temperature is set at 1050° C., and ammonia gas and trimethyl gallium gas are used as a source gas. To be more specific, ammonia gas is allowed to flow at a flow rate being as slightly large as typically 10 l/min and trimethyl gallium gas is fed at such a flow rate that the film growth rate becomes about 4 μm/hr. Under such a condition, both the gases are allowed to react with each other at atmospheric pressure. In such a MOCVD method, GaN is selectively grown from the facets 1 in the lateral direction, that is, in the <11-20> direction along the disposition plane of the underlying semiconductor layer 2. By continuing the selective growth, the portions of GaN grown from the opposed facets 1 collide into each other, to bury grooves 10 between the stripes 11, and by further continuing the selective growth, GaN is grown in the direction perpendicular to the disposition plane of the underlying semiconductor layer 2. In this way, the selectively grown/buried semiconductor layer 3 made from GaN and having a flat surface is formed to entirely cover the underlying semiconductor layer 2.

Even in this embodiment, as a result of observing the selectively grown/buried semiconductor layer 3 by the transmission electron microscope, it was confirmed that threading-dislocations "d" are bent at the facets 1. To be more specific, at the stage of selective growth of GaN for forming the selectively grown/buried semiconductor layer 3, until the portions of GaN grown from the opposed facets 1 collide with each other, the dislocations "d" passing through the underlying semiconductor layer 12 in the direction substantially perpendicular to the c-axis are bent at the facets 1, and extend not in the vertical direction but in the horizontal direction substantially along the disposition plane of the underlying semiconductor layer 2. Then, as described with reference to FIG. 10B, when the portions of GaN grown from the opposed facets 1 collide with each other, the dislocations "d" extending from the opposed facets 1 are joined to each other and are partially bent, and extend upwardly in the direction crossing the disposition plane of the underlying semiconductor layer 2, that is, in the stacked direction. As a result, the defect density in the selectively grown/buried semiconductor layer 3 is reduced to 1×10$^7$ /cm$^2$.

Accordingly, in the selectively grown/buried semiconductor layer 3, high defect density regions 4 having the threading-dislocations at a high density occur at the joined portions of the threading-dislocations; however, low defect density regions 5 having the dislocations at a low density are formed at the remaining portions.

Since the selectively grown/buried semiconductor layer 3 thus formed is in direct-contact with the underlying semiconductor layer 2 with any mask made from SiO$_2$ layer or the like for selective growth not put therebetween, a deviation in c-axis between the selectively grown/buried semiconductor layer 3 and the substrate 6 is in a range of 1° or less.

According to the fabrication method in this embodiment, since the low defect density regions 5 having the dislocations at a low density are formed and the deviation in crystal orientation is suppressed, a semiconductor thin film 40 including the selectively grown/buried semiconductor layer 3 having an extremely high quality can be formed. Accordingly, by providing a semiconductor element or a semiconductor element main body of a semiconductor device on the low defect density regions 5 of the semiconductor thin film 40, it is possible to obtain the semiconductor element or the semiconductor device with an extremely high reliability.

A semiconductor element of the present invention can be fabricated by using the semiconductor thin film 40 in each of the above-described embodiments shown in FIGS. 1 to 8.

Figure 13:
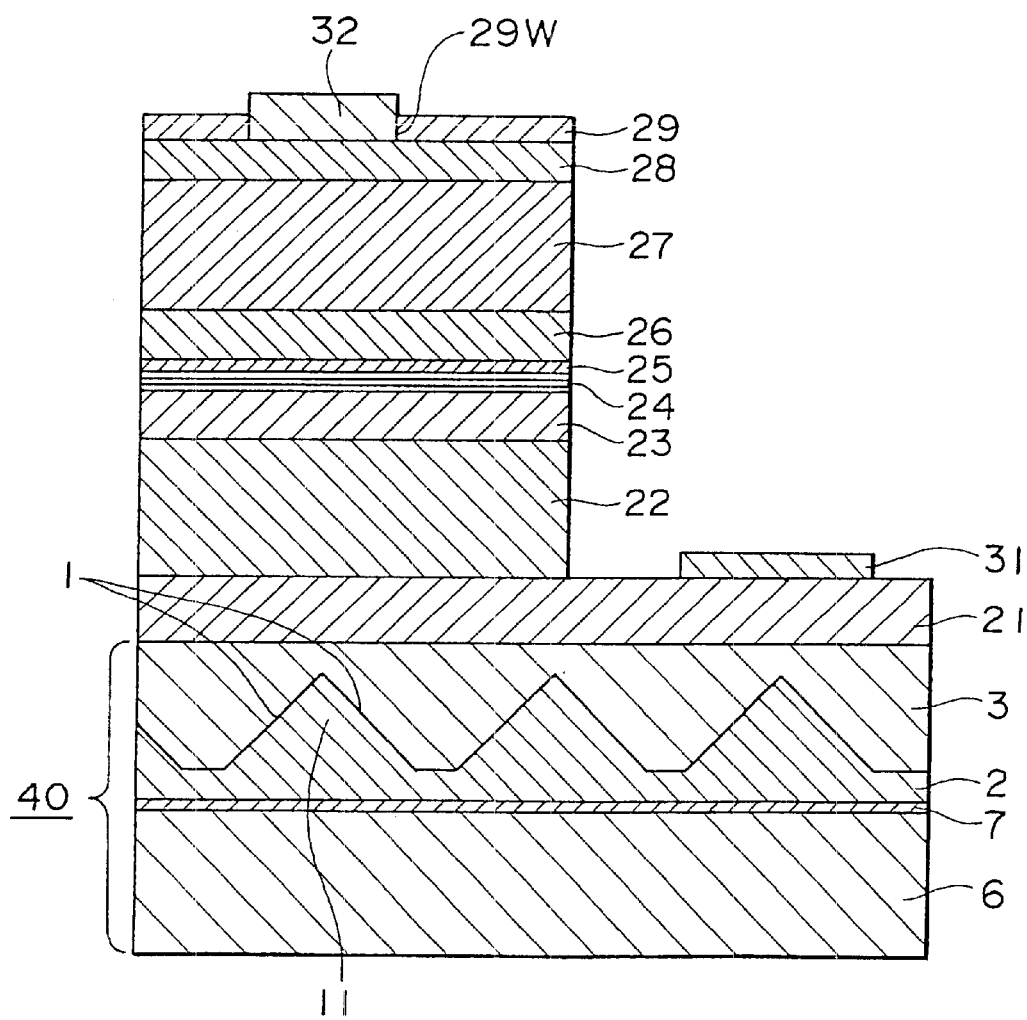
FIG. 13 is a schematic sectional view of one embodiment of a semiconductor light emitting element of the present invention.

FIG. 13 is a schematic sectional view of a semiconductor light emitting element as one embodiment of the semiconductor element of the present invention. In this embodiment, the semiconductor light emitting element is configured as a SCH (Separate Confinement Heterostructure) type semiconductor laser which has a semiconductor laser element main body formed on the semiconductor thin film 40 shown in FIG. 2 or which is formed as the semiconductor layer 8 of the semiconductor thin film 40 shown in FIG. 6.

Figure 6:
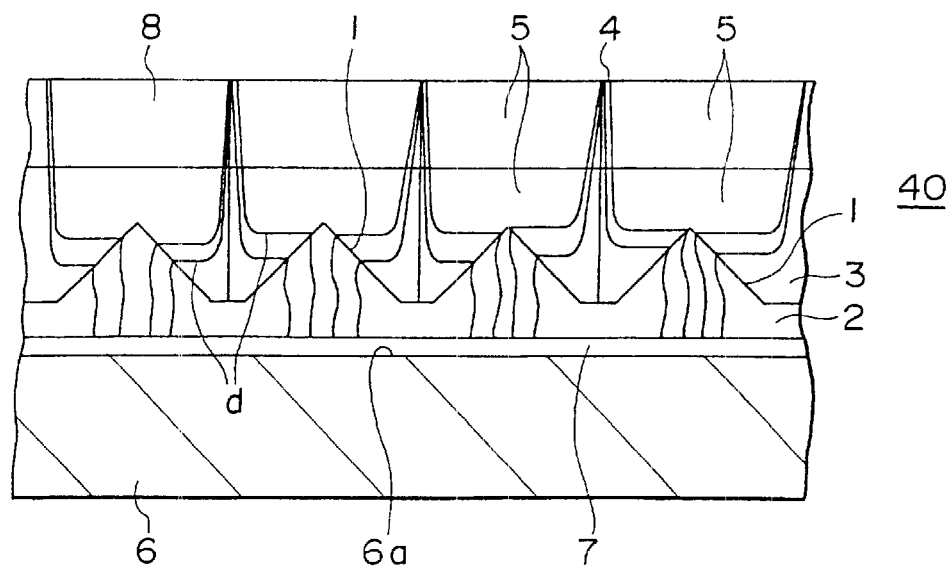
FIG. 6 is a schematic sectional view of a further embodiment of the semiconductor thin film of the present invention.

In FIG. 13, parts corresponding to those in FIGS. 2 and 6 are designated by the same characters and the overlapped explanation is omitted. In this embodiment, a first contacting layer 21, a first cladding layer 22, and a first guiding layer 23, each of which is of a first conduction type, for example, n-type, are epitaxially grown in sequence on the selectively grown/buried semiconductor layer 3. Then, an active layer 24 and a deterioration preventive layer 25, and further a second guiding layer 26, a second cladding layer 27, and a second contacting layer 28, each of which is of a second conduction type, for example p-type, are sequentially stacked on the first guiding layer 23.

An insulating layer 29 made from SiO$_2$ is formed on the second contacting layer 28.

These layers thus epitaxially grown are partially etched from the insulating layer 29 side until the first contacting layer 21 is exposed, to form an etching groove, and a first electrode 31 is formed in ohmic contact with the exposed portion of the first contacting layer 21. A second electrode 32 is formed in ohmic contact with the stripe shaped exposed portion of the second contacting layer 28 through a stripe shaped opening 29w which is formed in the insulating layer 29 in such a manner as to extend in the direction perpendicular to the paper plane in FIG. 13, that is, along the extending direction of the facets 1 or stripe 11 of the semiconductor thin film 40.

Next, one embodiment of a method of fabricating the above semiconductor element configured as the semiconductor laser element according to the present invention will be described. In accordance with the same method as that described with reference to FIGS. 9A to 9C and FIGS. 10A and 10B, an underlying semiconductor layer 2 in which facets 1 are arranged, and a selectively grown/buried semiconductor layer 3 are formed on a substrate 6 via a buffer layer 7. Then, a first contacting layer 21 made from n-type GaN doped with Si and having a thickness of 2 μm, a first cladding layer 22 made from n-type AlGaN alloy crystal doped with Si and having a thickness of 0.5 μm, and a first guiding layer 23 made from n-type GaN doped with Si having a thickness of 0.1 μm are epitaxially grown in sequence on the flat surface of the selectively grown/buried semiconductor layer 3.

An active layer 24 having a multi-quantum well structure of a quantum well layer having a thickness of 3 nm, a barrier layer having a thickness of 4 nm, and a GaInN alloy crystal layer having a thickness of 4 nm is expitaxially grown on the first guiding layer 23.

A deterioration preventive layer 25 made from AlGaN and having a thickness of 20 nm is epitaxially grown on the active layer 24. Then, a second guiding layer 26 made from p-type GaN doped with a p-type impurity, Mg and having a thickness of 0.1 μm, a second cladding layer 27 made from p-type AlGaN alloy crystal and having a thickness of 0.5 μm, and a second contacting layer 28 made from p-type GaN alloy crystal and having a thickness of 0.5 μm are epitaxially grown in sequence on the deterioration preventive layer 25.

In the epitaxial growth of the above semiconductor layers 21 to 28, a substrate temperature is set in a range of 800 to 1000° C.; and trimethy aluminum gas ((CH$_3$)$_3$Al) is used as a source gas for aluminum, trimethyl gallium gas ((CH$_3$)$_3$Ga) is used as a source gas for gallium, ammonia gas (NH$_3$) is used as a source gas for nitrogen, silane gas (SiH$_4$) is used as a source gas for silicon, and bis(methylcyclopentadienyl) magnesium gas (MeCp$_2$Mg) or bis(cyclopentadienyl) magnesium gas (Cp$_2$Mg) is used as a source gas for magnesium.

The insulating layer 29 is formed by the CVD method, and the stripe shaped opening 29w is formed in the insulating layer 29 by photolithography and pattern etching.

In this embodiment, the second electrode 32 is formed in ohmic contact with the contacting layer 28 through the opening 29w; however, it can be formed by a lift-off method. In this case, a photoresist layer having a pattern covering a portion other than electrode forming portion is formed by photolithography; Ni and Au are sequentially vapor-deposited over the entire surface; and the patterned resist layer is lifted-off, that is, removed to thereby remove Ni and Au vapor-deposited on the patterned resist layer. In this way, the second electrode 32 made from Ni and Au is formed.

At a portion of the stacked layers on which a first electrode 31 is to be formed, the insulating layer 29, the contacting layer 28, the second cladding layer 27, the second guiding layer 26, the deterioration preventive layer 25, the active layer 24, the first guiding layer 23, and the first cladding layer 22 are selectively removed in sequence. Then, Ti, Al and Au are selectively vapor-deposited in sequence on the exposed portion of the n-type contacting layer 21, to form a first electrode 31.

In the semiconductor layers 21 to 28 thus epitaxially grown, the density of threading-dislocations is extremely low because the density of the threading-dislocations in the selectively grown/buried semiconductor layer 3 is extremely low as described above, and particularly, low defect density regions are formed over the low defect density regions 5 shown in FIGS. 2 or 6, and accordingly, in this embodiment, a laser resonator is formed at a position over the low defect density region, that is, substantially over the stripe 11.

To be more specific, in this embodiment, a current injection region is restrictively formed in the active region 24 at a position under the contact portion of the second electrode 32 with the contacting layer 28 through the stripe shaped opening 29w, to form a laser resonator thereat. Accordingly, the opening 29w of the insulating layer 29 equivalent to the contact portion of the second electrode 32 with the contacting layer 28 is formed over the stripe 11.

After formation of the electrodes 31 and 32, the semiconductor element is cut by cleavage to set the length of the laser resonator to a specific value. The cut planes form mirror-surfaces constituting end planes of the resonator.

In the semiconductor laser having the above configuration, when a current is carried in the forward direction between the first and second electrodes 31 and 32, it flows in the active layer 24, with a result that light emission occurs by re-combination of electrons and positive holes.

Since at least the operational portion of the semiconductor light emitting element, that is, the semiconductor laser in this embodiment is formed in the region having threading-dislocations at a low density and also occurrence of the deviation in crystal orientation is avoided, it is possible to reduce a threshold current and a drive voltage, and hence to moderate the deterioration of the characteristics caused by the increased threshold current and drive voltage. As a result, the life time of the semiconductor laser in this embodiment can be prolonged.

Figure 14:
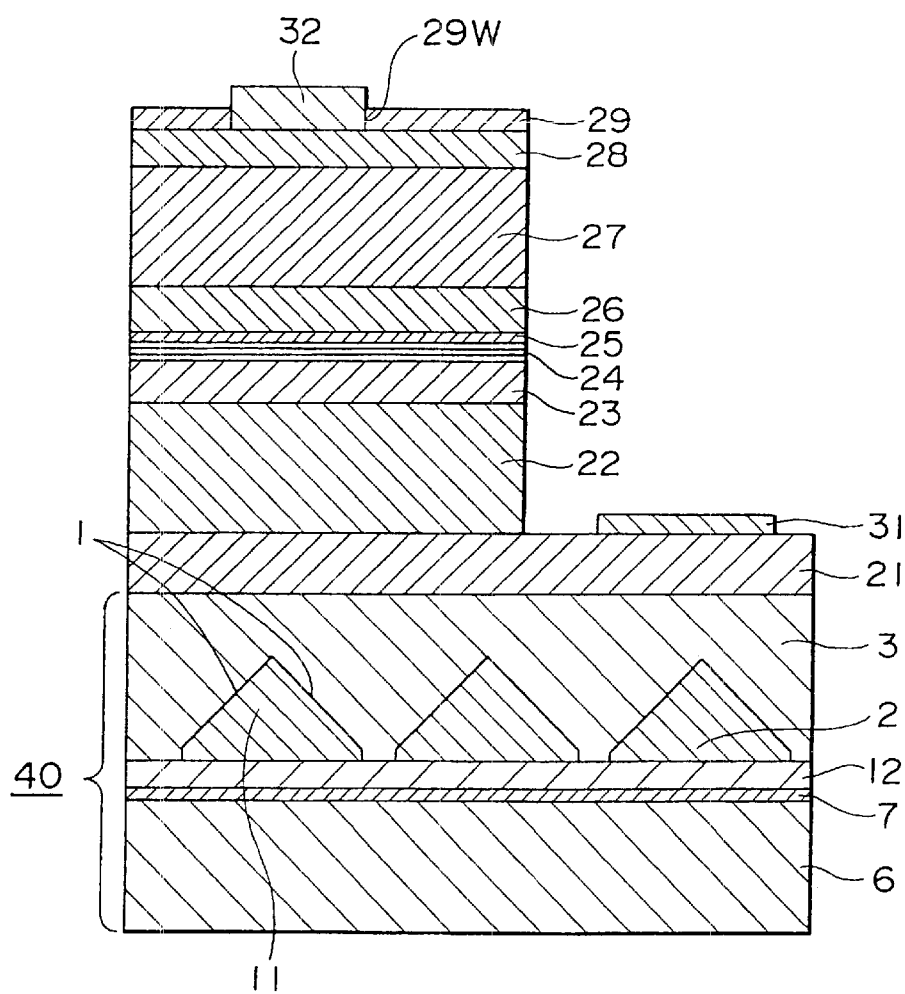
FIG. 14 is a schematic sectional view of another embodiment of the semiconductor light emitting element of the present invention.

FIG. 14 is a schematic sectional view of another embodiment of the semiconductor element of the present invention. In this embodiment, the semiconductor element is configured as a semiconductor laser having the SCH structure which is formed on the semiconductor thin film 40 of the present invention shown in each of FIGS. 3 and 7.

In this embodiment, the semiconductor thin film 40 of the semiconductor laser may be fabrication in the same manner as that described with reference to FIGS. 11A to 11C and 12A and 12B; and a semiconductor laser main body of the semiconductor laser may be of the same structure as that described with reference to FIG. 13 and the fabrication method thereof may be also the same as that described with reference to FIG. 13.

Figure 7:
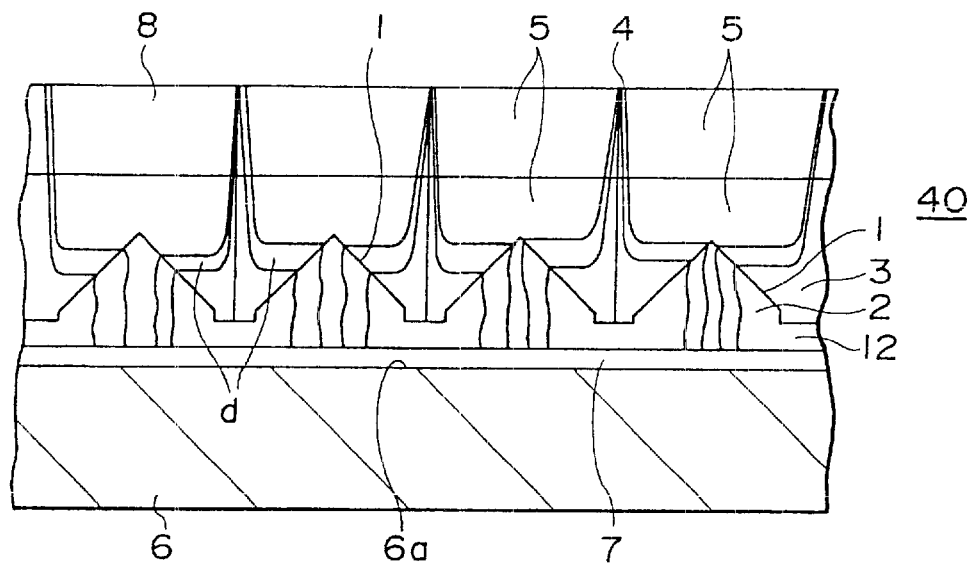
FIG. 7 is a schematic sectional view of a further embodiment of the semiconductor thin film of the present invention.
Figure 8:
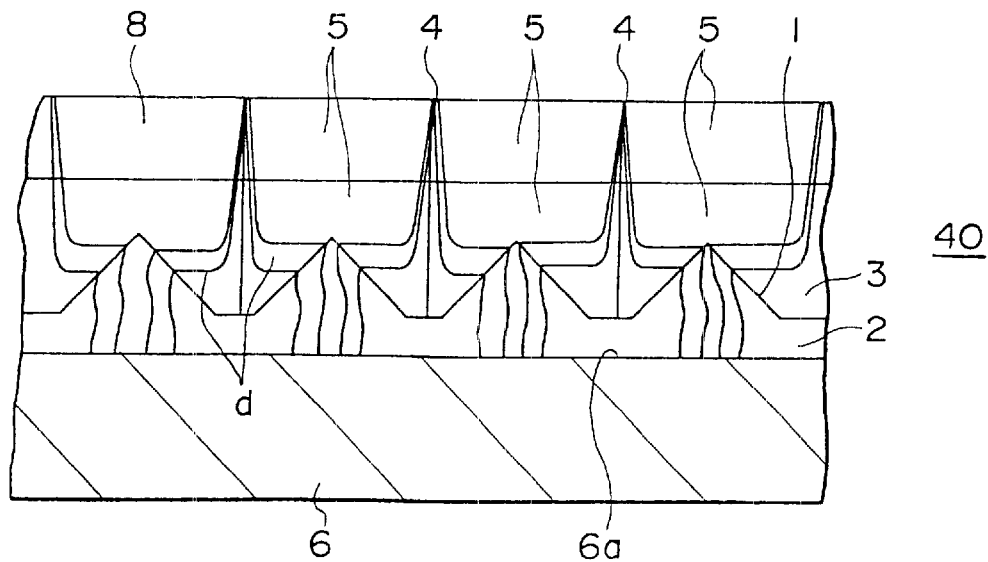
FIG. 8 is a schematic sectional view of a further embodiment of the semiconductor thin film of the present invention.

In FIG. 14, parts corresponding to those in FIGS. 3, 7 and 13 are designated by the same characters and the overlapped explanation thereof is omitted.

Even in this embodiment, like the semiconductor laser shown in FIG. 13, since at least the operational portion is formed in a region having threading-dislocations at a low density and also occurrence of the deviation in crystal orientation is avoided, it is possible to reduce a threshold current and a drive voltage, and hence to moderate the deterioration of the characteristics caused by the increased threshold current and drive voltage. As a result, the life time of the semiconductor laser in this embodiment can be prolonged.

It should be noted that the present invention is not limited to the above-described embodiments, and it is to be understood that various variations may be made without departing from the technical thought of the present invention. For example, in the case of forming the stripes 11, that is, the facets 1 by selective growth in accordance with the steps shown in FIGS. 11A to 11C, by selecting the extending direction of the stripes 11 to the <1-100> direction, the facets 1 each being tilted at about 58° with respect to the C-face of the {11-22} faces, that is, to the disposition plane of the underlying semiconductor layer 2. In this way, the extending direction of the facets 1, and accordingly, the extending direction of the high defect density regions 4 and the low defect density regions 5 can be selected to any one of directions along various crystal axes.

With respect to each of the semiconductor layers 21 to 28 shown in FIGS. 13 and 14, the conduction type may be reversed to that described above, and the composition may be different from that described above. That is to say, the present invention can be applied to the semiconductor element in which the above-described semiconductor layers are made from other suitable semiconductors.

According to the present invention, however, it is particularly effective that each of the semiconductor layers is made from a compound semiconductor composed of a group III nitride containing nitrogen (N) and at least one kind of group III element selected from a group consisting of Al, Ga, B and In.

While the semiconductor laser in each of the above embodiments has the SCH structure in which the first and second guiding layers 23 and 26 are disposed with the active layer 24 put therebetween, the present invention can be applied to a semiconductor light emitting element, such as a semiconductor laser or a light emitting diode, which has a different structure such as a DH (Double Hetero) structure with no guiding layers.

The semiconductor element of the present invention is not limited to the semiconductor light emitting element but may be another element such as a FET (Field Effect Transistor).

A semiconductor device of the present invention can be configured as a single semiconductor device having the above-described semiconductor element or an integrated circuit system in which a plurality of semiconductor elements are formed on a common semiconductor thin film fabricated in accordance with the present invention.

In this case, each of the semiconductor thin films shown in FIGS. 1 to 8 may be fabricated in accordance with each of the methods described with reference to FIGS. 9A to 12B, and each of the semiconductor elements such as semiconductor light emitting elements having the structures shown in FIGS. 13 and 14 may be fabricated in accordance with each of the methods described with reference to FIGS. 13 and 14.

By using the semiconductor thin film or the semiconductor element described above, it is possible to fabricate a semiconductor device having excellent characteristics.

In fabricating a semiconductor integrated circuit system, the facets 1 and accordingly the low defect density regions 5 in the common semiconductor thin film 40 may be not necessarily arranged at equal intervals.

Additionally, while each semiconductor layer may be grown by the MOCVD method or halide vapor-deposition method in the above embodiments, it may be grown by another vapor-deposition method such as a MBE (Molecular Beam Epitaxy) method. For example, the semiconductor layers 21 to 28 may be formed by the MBE method or the halide method.

As described above, in the semiconductor thin film, the semiconductor element, and the semiconductor device, and the fabrication methods thereof according to the present invention, since threading-dislocations are formed in the selectively grown/buried semiconductor layer 3 in such a manner that each of the threading-dislocations bendingly extends from one of the facets 1, being joined to another of the threading-dislocations extending from the opposed one of the facets 1 along with epitaxial growth from the facets 1, and bendingly extends from the joined portion, it is possible to significantly reduce the defect density of at least an operational portion of the semiconductor element main body by disposing the operational region at a low defect density region; and since the selectively grown/buried semiconductor layer 3 is grown not via the selective growth mask made from $SiO_2$ or the like, a deviation in crystal orientation can be suppressed at a value of 0.1° or less. As a result, according to the present invention, it is possible to provide a semiconductor thin film having a high quality, and hence to provide a semiconductor element and a semiconductor device having good characteristics, high reliability and prolonged life time by using the semiconductor thin film.

What is claimed is:

1. A method of fabricating a semiconductor thin film, comprising the steps of:
    forming an underlying semiconductor layer on a substrate;
    reactive ion etching the underlying semiconductor layer using a mask in such a manner that a plurality of facets are arranged in the underlying semiconductor layer; and
    growing a selectively grown/buried semiconductor layer in such a manner that the selectively grown/buried semiconductor layer covers the underlying semiconductor layer;
    wherein the facets are formed by planes tilted with respect to the disposition plane of the underlying semiconductor layer.

2. A method of fabricating a semiconductor thin film according to claim 1, wherein said step of growing the selectively grown/buried semiconductor layer comprises the step of:
    growing the selectively grown/buried semiconductor layer from the facets of the underlying semiconductor layer in the direction substantially along the disposition plane of the underlying semiconductor layer;
    whereby threading-dislocations are formed in the selectively grown/buried semiconductor layer in such a manner that each of the threading-dislocations bendingly extends from one of the facets of the underlying semiconductor layer in the direction substantially along the disposition plane of the underlying semiconductor layer, being joined to another of the threading-dislocations bendingly extending from the opposed one of the facets, and bendingly extends from the joined portion in the direction crossing the disposition plane of the underlying semiconductor layer.

3. A method of fabricating a semiconductor thin film according to claim 1, wherein a deviation in crystal orientation between the underlying semiconductor layer and the selectively grown/buried semiconductor layer is in a range of 0.1° or less.

4. A method of fabricating a semiconductor thin film according to claim 1, wherein said step of forming the underlying semiconductor layer is performed by reactive ion etching using a mask made from silicon dioxide, silicon nitride, or aluminum oxide.

5. A method of fabricating a semiconductor thin film according to claim 1, further comprising the step of:
    growing a compound semiconductor layer on the selectively grown/buried semiconductor layer, the compound semiconductor layer being made from a group III nitride containing nitrogen (N) and at least one kind of group III element selected from a group consisting of gallium (Ga), aluminum (Al), boron (B), and indium (In).

6. A method of fabricating a semiconductor thin film according to claim 1, wherein the selectively grown/buried semiconductor layer is made from a compound semiconductor composed of a group III nitride containing gallium (Ga) and nitrogen (N).

7. A method of fabricating a semiconductor thin film according to claim 1, wherein said step of growing the selectively grown/buried semiconductor layer is performed by a chemical vapor deposition method.

8. A method of fabricating a semiconductor thin film according to claim 1, wherein the substrate is made from sapphire.

9. A method of fabricating a semiconductor thin film according to claim 1, wherein the substrate is made from silicon carbide (SiC).

10. A method of fabricating a semiconductor thin film according to claim 1, wherein the substrate is made from a single crystal of gallium nitride.

11. A method of fabricating a semiconductor thin film according to claim 1, wherein the underlying semiconductor layer is directly formed on the substrate.

12. A method of fabricating a semiconductor thin film, comprising the steps of:
    forming a mask on a substrate;
    forming an underlying semiconductor layer on said substrate by selective growth in such a manner that a plurality of facets are arranged in the underlying semiconductor layer due to the presence of said mask;
    removing said mask; and
    growing a selectively grown/buried semiconductor layer in such a manner that the selectively grown/buried semiconductor layer covers the underlying semiconductor layer;
    wherein the facets are formed by planes tilted with respect to the disposition plane of the underlying semiconductor layer.

13. A method of fabricating a semiconductor thin film according to claim 12, wherein said step of growing the selectively grown/buried semiconductor layer comprises the step of:
    growing the selectively grown/buried semiconductor layer from the facets of the underlying semiconductor layer in the direction substantially along the disposition plane of the underlying semiconductor layer;
    whereby threading-dislocations are formed in the selectively grown/buried semiconductor layer in such a manner that each of the threading-dislocations bendingly extends from one of the facets of the underlying semiconductor layer in the direction substantially along the disposition plane of the underlying semiconductor layer, being joined to another of the threading-dislocations bendingly extending from the opposed one of the facets, and bendingly extends from the joined portion in the direction crossing the disposition plane of the underlying semiconductor layer.

14. A method of fabricating a semiconductor thin film according to claim 12, wherein a deviation in crystal orientation between the underlying semiconductor layer and the selectively grown/buried semiconductor layer is in a range of 0.1° or less.

15. A method of fabricating a semiconductor thin film according to claim 12, wherein said step of forming the underlying semiconductor layer by selective growth in such a manner that the plurality of facets are arranged in the underlying semiconductor layer is performed by using a mask made from silicon dioxide, silicon nitride, or aluminum oxide.

16. A method of fabricating a semiconductor thin film according to claim 12, further comprising the step of:
    growing a compound semiconductor layer on the selectively grown/buried semiconductor layer, the compound semiconductor layer being made from a group III nitride containing nitrogen (N) and at least one kind of group III element selected from a group consisting of gallium (Ga), aluminum (Al), boron (B), and indium (In).

17. A method of fabricating a semiconductor thin film according to claim 12, wherein the selectively grown/buried semiconductor layer is made from a compound semiconductor composed of a group III nitride containing gallium (Ga) and nitrogen (N).

18. A method of fabricating a semiconductor thin film according to claim 12, wherein said step of growing the selectively grown/buried semiconductor layer is performed by a chemical vapor deposition method.

19. A method of fabricating a semiconductor thin film according to claim 12, wherein the substrate is made from sapphire.

20. A method of fabricating a semiconductor thin film according to claim 12, wherein the substrate is made from silicon carbide (SiC).

21. A method of fabricating a semiconductor thin film according to claim 12, wherein the substrate is made from a single crystal of gallium nitride.

22. A method of fabricating a semiconductor thin film according to claim 12, wherein the underlying semiconductor layer is directly formed on the substrate.

23. A method of fabricating a semiconductor thin film according to claim 12, wherein said selectively grown/buried semiconductor layer is grown in such a manner that it directly contacts a portion of said substrate at which said mask existed when forming said underlying semiconductor layer.

24. A method of fabricating a semiconductor element, comprising the steps of:
    forming an underlying semiconductor layer on a substrate;
    reactive ion etching the underlying semiconductor layer using a mask in such a manner that a plurality of facets are arranged in the underlying semiconductor layer;
    growing a selectively grown/buried semiconductor layer in such a manner that the selectively grown/buried semiconductor layer covers the underlying semiconductor layer; and
    forming a semiconductor main body;
    wherein the facets are formed by planes tilted with respect to the disposition plane of the underlying semiconductor layer.

25. A method of fabricating a semiconductor element according to claim 24, wherein said step of growing the selectively grown/buried semiconductor layer comprises the step of:
    growing the selectively grown/buried semiconductor layer from the facets of the underlying semiconductor layer in the direction substantially along the disposition plane of the underlying semiconductor layer;
    whereby threading-dislocations are formed in the selectively grown/buried semiconductor layer in such a manner that each of the threading-dislocations bendingly extends from one of the facets of the underlying semiconductor layer in the direction substantially along the disposition plane of the underlying semiconductor layer, being joined to another of the threading-dislocations bendingly extending from the opposed one of the facets, and bendingly extends from the joined portion in the direction crossing the disposition plane of the underlying semiconductor layer.

26. A method of fabricating a semiconductor element according to claim 24, wherein a deviation in crystal orientation between the underlying semiconductor layer and the selectively grown/buried semiconductor layer is in a range of 0.1° or less.

27. A method of fabricating a semiconductor element according to claim 24, wherein said step of forming the underlying semiconductor layer is performed by reactive ion etching using a mask made from silicon dioxide, silicon nitride, or aluminum oxide.

28. A method of fabricating a semiconductor element according to claim 24, further comprising the step of:
    growing a compound semiconductor layer on the selectively grown/buried semiconductor layer, the compound semiconductor layer being made from a group III nitride containing nitrogen (N) and at least one kind of group III element selected from a group consisting of gallium (Ga), aluminum (Al), boron (B), and indium (In).

29. A method of fabricating a semiconductor element according to claim 24, wherein the selectively grown/buried semiconductor layer is made from a compound semiconductor composed of a group III nitride containing gallium (Ga) and nitrogen (N).

30. A method of fabricating a semiconductor element according to claim 24, wherein said step of growing the selectively grown/buried semiconductor layer is performed by a chemical vapor deposition method.

31. A method of fabricating a semiconductor element according to claim 24, wherein the substrate is made from sapphire.

32. A method of fabricating a semiconductor element according to claim 24, wherein the substrate is made from silicon carbide (SiC).

33. A method of fabricating a semiconductor element according to claim 24, wherein the substrate is made from a single crystal of gallium nitride.

34. A method of fabricating a semiconductor element according to claim 24, wherein the underlying semiconductor layer is directly formed on the substrate.

35. A method of fabricating a semiconductor element, comprising the steps of:
    forming a mask on a substrate;
    forming an underlying semiconductor layer on said substrate by selective growth in such a manner that a plurality of facets are arranged in the underlying semiconductor layer due to the presence of said mask;
    removing said mask;
    growing a selectively grown/buried semiconductor layer in such a manner that the selectively grown/buried semiconductor layer covers the underlying semiconductor layer, to form a semiconductor thin film composed of the underlying semiconductor layer and the selectively grown/buried semiconductor layer; and
    forming a semiconductor main body on the semiconductor thin film;
    wherein the facets are formed by planes tilted with respect to the disposition plane of the underlying semiconductor layer.

36. A method of fabricating a semiconductor element according to claim 35, wherein said step of growing the selectively grown/buried semiconductor layer comprises the step of:
    growing the selectively grown/buried semiconductor layer from the facets of the underlying semiconductor layer in the direction substantially along the disposition plane of the underlying semiconductor layer;
    whereby threading-dislocations are formed in the selectively grown/buried semiconductor layer in such a manner that each of the threading-dislocations bendingly extends from one of the facets of the underlying semiconductor layer in the direction substantially along the disposition plane of the underlying semiconductor layer, being joined to another of the threading-dislocations bendingly extending from the opposed one of the facets, and bendingly extends from the joined portion in the direction crossing the disposition plane of the underlying semiconductor layer.

37. A method of fabricating a semiconductor element according to claim 35, wherein a deviation in crystal orientation between the underlying semiconductor layer and the selectively grown/buried semiconductor layer is in a range of 0.1° or less.

38. A method of fabricating a semiconductor element according to claim 35, wherein said step of forming the underlying semiconductor layer by selective growth in such a manner that the plurality of facets are arranged in the underlying semiconductor layer is performed by using a mask made from silicon dioxide, silicon nitride, or aluminum oxide.

39. A method of fabricating a semiconductor element according to claim 35, further comprising the step of:
growing a compound semiconductor layer on the selectively grown/buried semiconductor layer, the compound semiconductor layer being made from a group III nitride containing nitrogen (N) and at least one kind of group III element selected from a group consisting of gallium (Ga), aluminum (Al), boron (B), and indium (In).

40. A method of fabricating a semiconductor element according to claim 35, wherein the selectively grown/buried semiconductor layer is made from a compound semiconductor composed of a group III nitride containing gallium (Ga) and nitrogen (N).

41. A method of fabricating a semiconductor element according to claim 35, wherein said step of growing the selectively grown/buried semiconductor layer is performed by a chemical vapor deposition method.

42. A method of fabricating a semiconductor element according to claim 35, wherein the substrate is made from sapphire.

43. A method of fabricating a semiconductor element according to claim 35, wherein the substrate is made from silicon carbide (SiC).

44. A method of fabricating a semiconductor element according to claim 35, wherein the substrate is made from a single crystal of gallium nitride.

45. A method of fabricating a semiconductor element according to claim 35, wherein the underlying semiconductor layer is directly formed on the substrate.

46. A method of fabricating a semiconductor element according to claim 35, wherein said selectively grown/buried semiconductor layer is grown in such a manner that it directly contacts a portion of said substrate at which said mask existed when forming said underlying semiconductor layer.

47. A method of fabricating a semiconductor device, comprising the steps of:

forming an underlying semiconductor layer on a substrate;

reactive ion etching the underlying semiconductor layer using a mask in such a manner that a plurality of facets are arranged in the underlying semiconductor layer;

growing a selectively grown/buried semiconductor layer in such a manner that the selectively grown/buried semiconductor layer covers the underlying semiconductor layer, to form a semiconductor thin film; and forming a semiconductor main body on the semiconductor thin film, to form a semiconductor element;

wherein the facets are formed by planes tilted with respect to the disposition plane of the underlying semiconductor layer.

48. A method of fabricating a semiconductor device, comprising the steps of:

forming a mask on a substrate;

forming an underlying semiconductor layer on said substrate by selective growth in such a manner that a plurality of facets are arranged in the underlying semiconductor layer due to the presence of said mask;

removing said mask;

growing a selectively grown/buried semiconductor layer covers the underlying semiconductor layer, to form a semiconductor thin film; and forming a semiconductor main body on the semiconductor thin film, to form a semiconductor element;

wherein the facets are formed by planes tilted with respect to the disposition plane of the underlying semiconductor layer.

49. A method of fabricating a semiconductor device according to claim 48, wherein said selectively grown/buried semiconductor layer is grown in such a manner that it directly contacts a portion of said substrate at which said mask existed when forming said underlying semiconductor layer.

* * * * *